(12) United States Patent
Yamaguchi

(10) Patent No.: US 7,728,430 B2
(45) Date of Patent: Jun. 1, 2010

(54) SEMICONDUCTOR DEVICE AND MANUFACTURING METHOD THEREOF

(75) Inventor: Tadashi Yamaguchi, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 111 days.

(21) Appl. No.: 11/987,613

(22) Filed: Dec. 3, 2007

(65) Prior Publication Data

US 2008/0169561 A1    Jul. 17, 2008

(30) Foreign Application Priority Data

Jan. 12, 2007    (JP)   ............................. 2007-004430

(51) Int. Cl.
*H01L 23/48* (2006.01)
(52) U.S. Cl. .................. 257/737; 257/786; 257/E23.01
(58) Field of Classification Search ................ 257/778, 257/737, E23.01, E21.511, 786
See application file for complete search history.

(56) References Cited

U.S. PATENT DOCUMENTS 7,126,227 B2 * 10/2006 Yamaguchi ................. 257/778

FOREIGN PATENT DOCUMENTS

| JP | 2003-158217 | 5/2003 |
|---|---|---|
| JP | 2005-142186 | 6/2005 |
| JP | 2006-121120 | 5/2006 |

* cited by examiner

*Primary Examiner*—Thomas L Dickey
*Assistant Examiner*—Fazli Erdem
(74) *Attorney, Agent, or Firm*—Rabin & Berdo, PC

(57) ABSTRACT

A polygonal semiconductor device includes a substrate and a wiring layer. The substrate includes semiconductor circuit elements. The wiring layer includes a dielectric sealing layer, a plurality of first electrodes, and a plurality of second electrodes. The first and second electrodes both extend through the dielectric sealing layer in its thickness direction. The first electrodes are electrically connected to the semiconductor circuit elements. Each of the corners of the polygonal device is formed, throughout the thickness of the wiring layer, by one of the second electrodes. The corners of the device are thereby reinforced, as the electrode material is tougher than the dielectric sealing material.

13 Claims, 9 Drawing Sheets

SEMICONDUCTOR DEVICE AND MANUFACTURING METHOD THEREOF

BACKGROUND OF THE INVENTION

1. Field of the Invention

The present invention relates to a small semiconductor device, such as a device with a chip-scale package, and its manufacturing method.

2. Description of the Related Art

Semiconductor devices with chip-scale package structures have been proposed in Japanese Patent Application Publication Nos. 2003-158217 (paragraphs 0030-0031 and FIGS. 2(a) and 2(b)) and 2005-14286 (paragraphs 0027-0030 and FIGS. 1(a) to 1(c)).

A problem with these proposed semiconductor devices is that the four corners of each semiconductor chip are partly or completely formed from hardened resin layers that can easily be damaged if the chip is particularly small or thin.

SUMMARY OF THE INVENTION

An object of the present invention is to improve the robustness of a semiconductor device, particularly a semiconductor device with a chip-scale package.

The invented semiconductor device has a substrate including semiconductor circuit elements. A wiring layer is disposed on the substrate. The wiring layer has a polygonal planar shape with a plurality of corners, and includes a dielectric sealing layer, a plurality of first electrodes, and a plurality of second electrodes. The first and second electrodes both pass through the dielectric sealing layer in its thickness direction. The first electrodes are electrically connected to the semiconductor circuit elements. Each of the plurality of corners is formed, throughout the thickness of the wiring layer, by one of the second electrodes.

The first and second electrodes are preferably formed from a metal material.

Since the second electrodes are tougher than the dielectric sealing material, their corners are less likely to be damaged during handling of the semiconductor device, or when the semiconductor is diced from the wafer in which it is fabricated.

The invention also provides a method of manufacturing a semiconductor device comprising:

forming, on a substrate having semiconductor circuit elements, a dielectric sealing layer and a wiring layer, the wiring layer having a plurality of first electrodes passing through the dielectric sealing layer and connected to the semiconductor circuit elements, the wiring layer also having a plurality of second electrodes passing through the dielectric sealing layer; and cutting the substrate and the wiring layer into pieces such that in each piece, the wiring layer has a polygonal planar shape with a plurality of corners, and each of the plurality of corners is formed, throughout the thickness of the wiring layer, by one of the second electrodes.

In this method, the plurality of second electrodes forming the plurality of corners may have mutually identical shapes.

One of the plurality of second electrodes forming the plurality of corners may have a different shape from another one of the plurality of second electrodes forming the plurality of corners.

The substrate may be a wafer on which the semiconductor circuit elements and a dielectric layer are formed.

Forming the wiring layer may comprise:

forming the first and second electrodes by forming first and second redistribution wiring on the substrate, forming first posts on the first redistribution wiring to form the first electrodes, and forming second posts on the second redistribution wiring to form the second electrodes;

forming the dielectric sealing layer so as to cover the first and second electrodes; and exposing the first and second electrodes by partially removing the dielectric sealing layer.

The first and second electrodes may be formed from mutually identical metal materials.

The first and second electrodes may be formed from copper.

The second electrodes may be electrically disconnected from the semiconductor circuit elements.

The second electrodes may include parts that project into the dielectric sealing layer to lock the second electrodes to the dielectric sealing layer.

Said parts of the second electrodes may have a tapered shape with a base and a projecting end, the projecting end being narrower than the base.

DETAILED DESCRIPTION OF THE INVENTION

Figure 1:
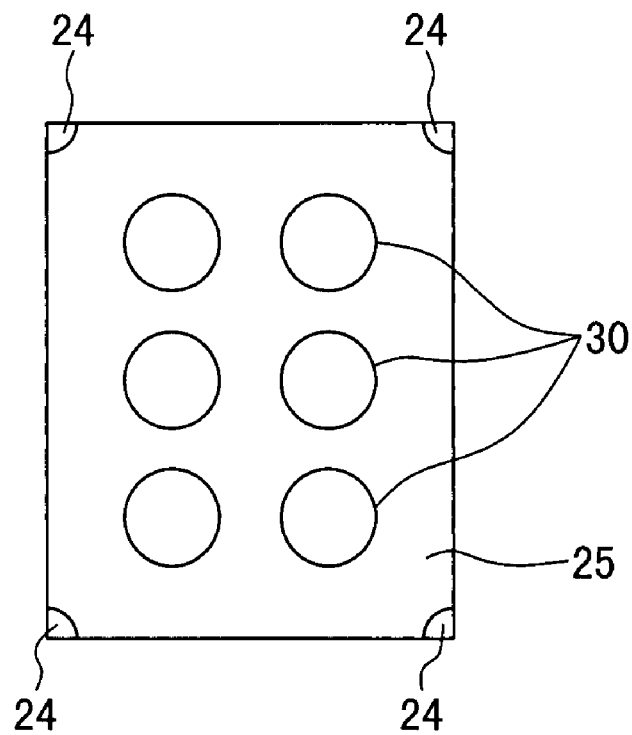
FIG. 1 is a schematic plan view.

Semiconductor devices of the chip-scale package type embodying the invention will now be described with reference to the attached drawings, in which like elements are indicated by like reference characters.

First Embodiment

Figure 2:
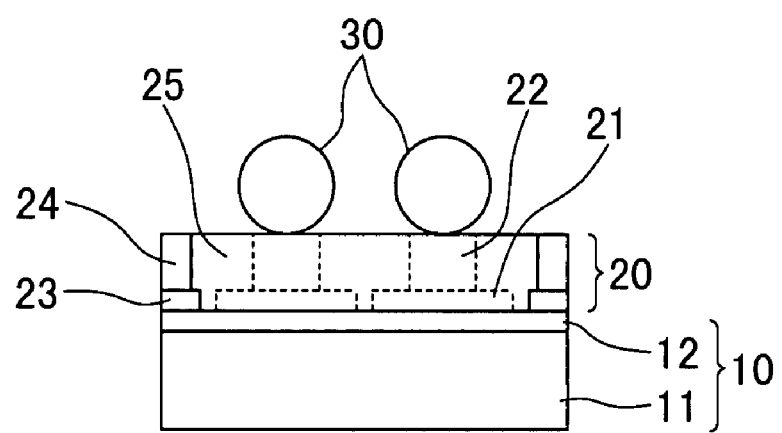
FIG. 2 is schematic side view of a semiconductor device according to a first embodiment of the invention.

The first embodiment, shown in plan view in FIG. 1 and in sectional view in FIG. 2, is a semiconductor device or chip including a substrate 10, a wiring layer 20, and metal bumps 30. The wiring layer 20 includes metal first redistribution parts 21, first posts 22, second redistribution parts 23, and second posts 24, and a dielectric sealing layer 25. Together, the substrate 10 and wiring layer 20 form a chip-scale package with bumps 30 on its surface. The first posts 22 extend from bumps 30 through the dielectric sealing layer 25 to the first redistribution parts 21, which are electrically connected to semiconductor circuit elements formed in the substrate 10. The second posts 24 are positioned in the wiring layer 20 at the four corners of the semiconductor device.

Next, a method of manufacturing a plurality of semiconductor devices with chip-scale packages of this type from a semiconductor wafer will be described.

Figure 3:
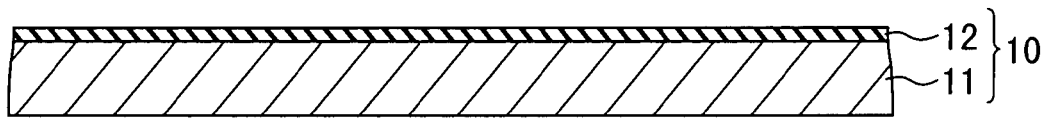
FIGS. 3 to 6 are schematic sectional views illustrating a method of manufacturing the semiconductor device in the first embodiment.

Referring to FIG. 3, semiconductor circuit elements (not shown) and metal interconnection wiring (not shown) are formed in and on the wafer 11, and the wafer 11 is covered by a dielectric layer 12 of a resin material such as polyimide to form a substrate 10. The substrate 10 shown in FIG. 2 is part of the substrate 10 in FIG. 3.

Figure 4:
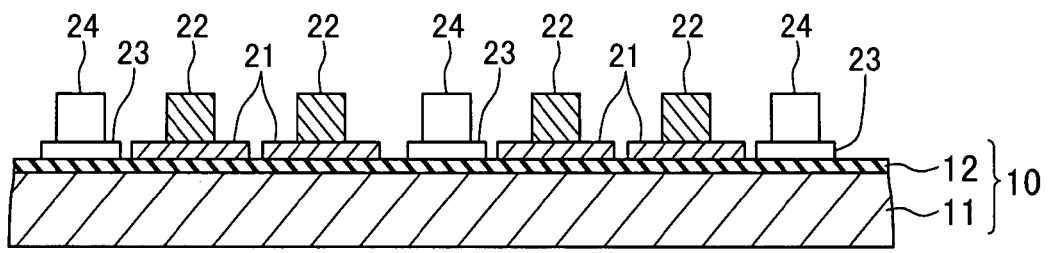

Referring to FIG. 4, the first redistribution parts 21 and the second redistribution parts 23 are formed on the substrate 10. The first redistribution parts 21 are electrically connected to the semiconductor circuit elements formed in the wafer 11. The second redistribution parts 23 are electrically disconnected from the semiconductor circuit elements formed in the wafer 11. The second redistribution parts 23 are formed at positions that will become the four corners of the semiconductor devices after dicing. The first and second redistribution parts 21, 23 are formed in the same process from a layer of a metal such as copper. Alternatively, the first redistribution parts 21 and second redistribution parts 23 may be formed in succession in different processes.

Referring to FIG. 4, the first posts 22 are formed on the first redistribution parts 21, and the second posts 24 are formed on the second redistribution parts 23. The first and second posts 22, 24 are formed in the same process from a layer of a metal such as copper. Alternatively, the first posts 22 and the second posts 24 may be formed in different processes. The first redistribution parts 21, first posts 22, second redistribution parts 23, and second posts 24 may all be formed from the same type of metal and may all be formed by, for example, an electroplating process. The first posts 22 are electrically connected to the semiconductor circuit elements formed in the wafer 11 via the first redistribution parts 21. The second posts 24 are not electrically connected to the semiconductor circuit elements formed in the wafer 11.

Figure 5:
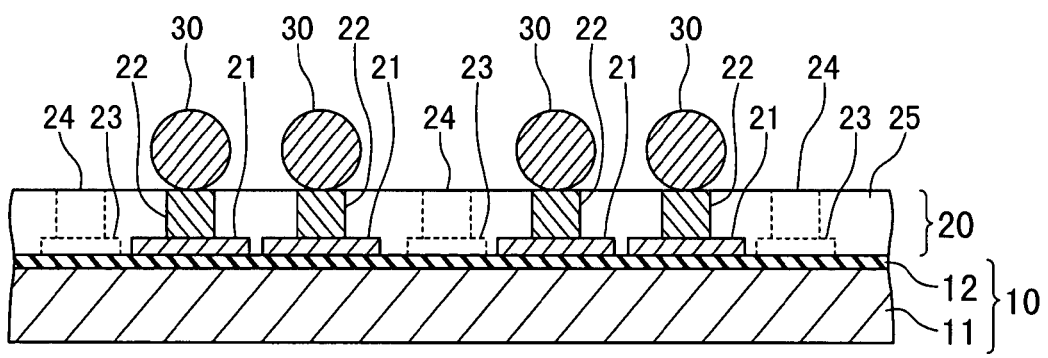

The dielectric sealing layer 25 is formed from a resin material such as polyimide so as to cover the first redistribution parts 21, first posts 22, second redistribution parts 23 and second posts 24; then the upper surface of the dielectric sealing layer 25 is removed by a type of cutting process to expose the upper surfaces of the first and second posts 22, 24 as shown in FIG. 5. This process also trims the upper surfaces of the first and second posts 22, 24, so that they are level with the upper surface of the dielectric sealing layer 25. The result is that first electrodes, comprising the first redistribution parts 21 and first posts 22, extend through the dielectric sealing layer 25 in its thickness direction, and second electrodes, comprising the second redistribution parts 23 and second posts 24, also extend through the dielectric sealing layer 25 in its thickness direction.

Figure 7:
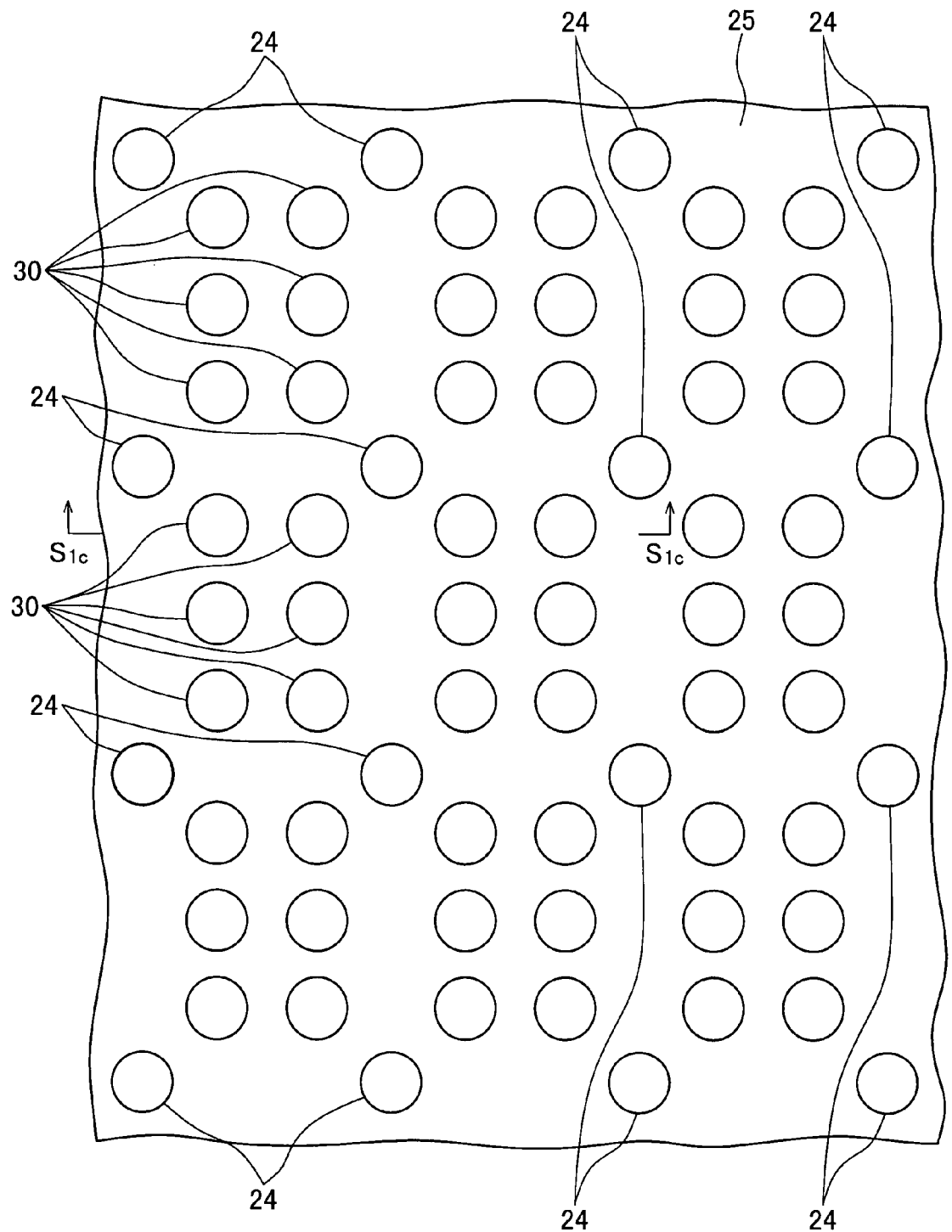
FIG. 7 is a schematic plan view of the semiconductor device in FIG. 5, before dicing.

Referring to FIG. 5, bumps 30 are mounted on the upper surfaces of the first posts 22 as electrodes for external connections. FIG. 7 shows a plan view corresponding to FIG. 5. Although FIG. 7 shows an arrangement in which four second posts 24 surround a group of six bumps 30 arranged in three rows and two columns, the number and arrangement of the first posts 22, that is, the bumps 30, and the arrangement of the second posts 24 are not limited to the example shown in FIG. 7.

Figure 6:
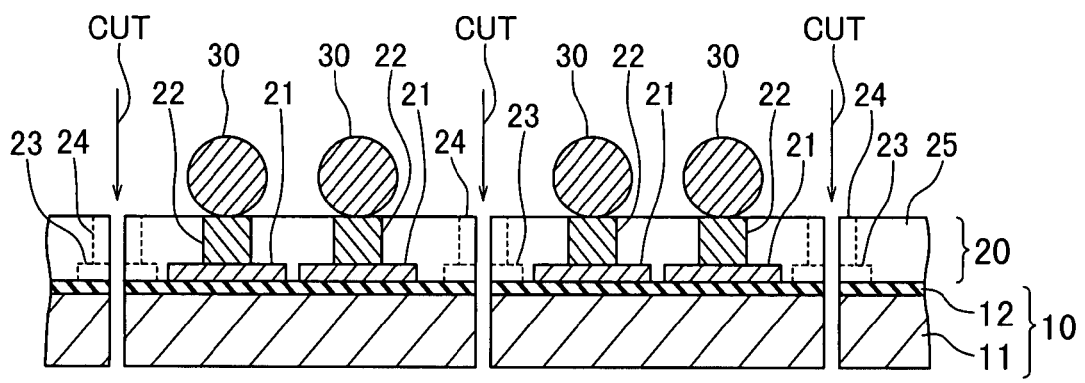
Figure 8:
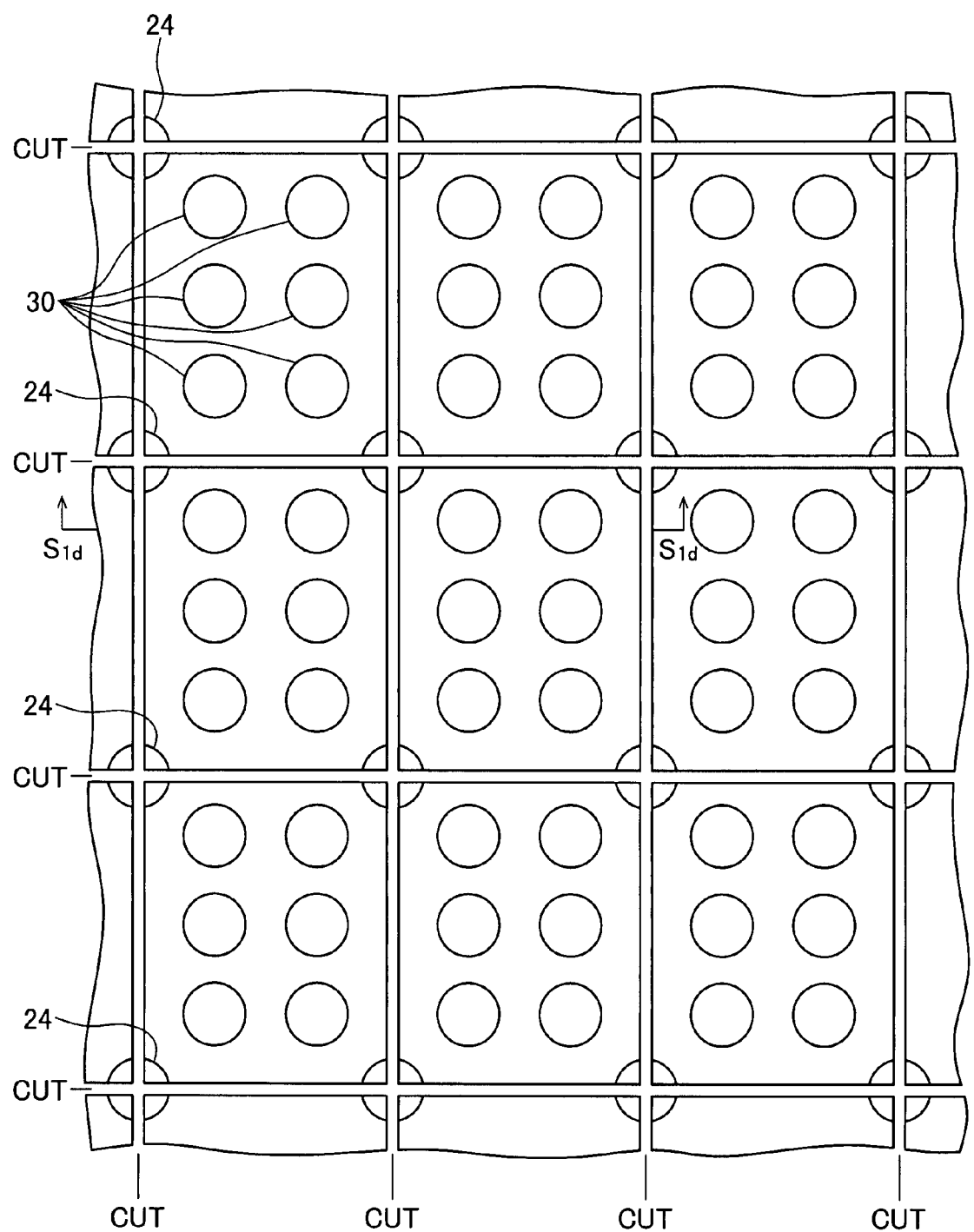
FIG. 8 is a schematic plan view illustrating the dicing positions shown in FIG. 6.

Referring to FIGS. 6 and 8, the substrate 10 and the wiring layer 20 are cut along lines marked 'CUT' that intersect at the second electrodes, so that at each corner of each resulting semiconductor device, the wiring layer 20 is formed by a remaining part of a second electrode (second redistribution part 23 and second post 24). The cutting process is a dicing process performed using a dicing blade.

The above process forms a plurality of semiconductor devices or chips of the type shown in FIGS. 1 and 2, each having a polygonal (rectangular) shape. The first electrodes (the first redistribution parts 21 and first posts 22) and the semiconductor circuit elements and interconnection wiring formed in the substrate 10 constitute an integrated circuit. The second electrodes, comprising the second redistribution parts 23 and second posts 24, are dummy electrodes; they are not connected to the semiconductor circuit elements formed in the substrate 10 and do not function as part of the integrated circuit. Instead, their function is to reinforce the four corners of the chip.

The chip shape is not limited to the rectangular shape shown in FIG. 1; square shapes and other polygonal shapes are also possible.

In the first embodiment, the second electrode, more specifically the second post 24, has the same shape at each corner. For a rectangular or square semiconductor device this shape is a fanlike shape constituting substantially one-quarter of a circular disc.

As described above, in the first embodiment, since the substrate 10 and the wiring layer 20 are diced along lines that intersect at the second electrodes (the second redistribution parts 23 and second posts 24), in the four corners of each semiconductor device, the cut surfaces of the second electrodes (the second redistribution parts 23 and the second posts 24) are exposed. As shown in FIGS. 1 and 2, accordingly, each of the four corners of the semiconductor device presents a tough metal surface, instead of a more brittle resin surface, for the full thickness of the wiring layer 20. Conventional semiconductor devices with chip-scale packages are particularly vulnerable to impact damage at their corners, and such damage can easily lead to electrical malfunctions. In the first embodiment, the second electrodes protect the corners by acting as bumpers that absorb the effect of external impact. The semiconductor devices formed in the first embodiment can survive external impacts that would chip, crack, or otherwise damage the dielectric sealing layer of a conventional semiconductor device, so they are more reliable and less likely to malfunction than conventional semiconductor devices.

Second Embodiment

Figure 9:
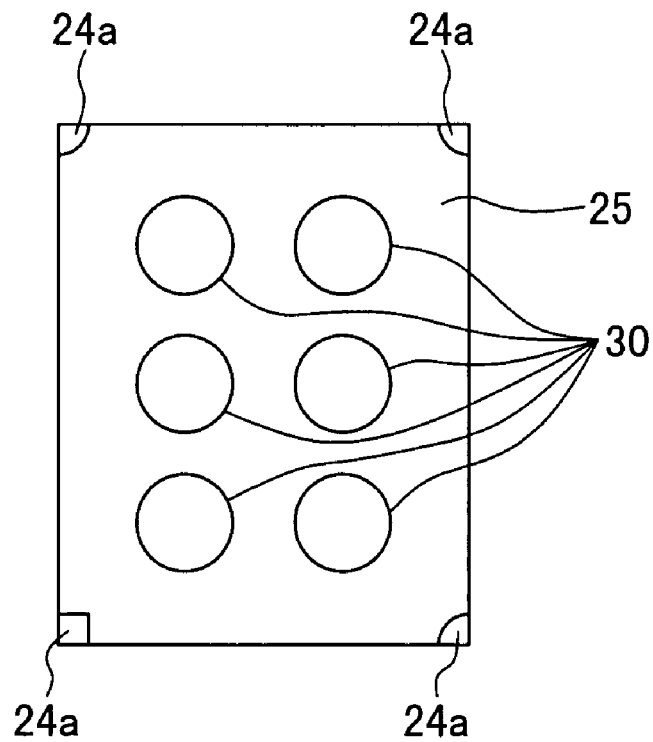
FIG. 9 is a schematic plan view and FIG. 10 is schematic side view of a semiconductor device according to a second embodiment of the invention.
Figure 10:
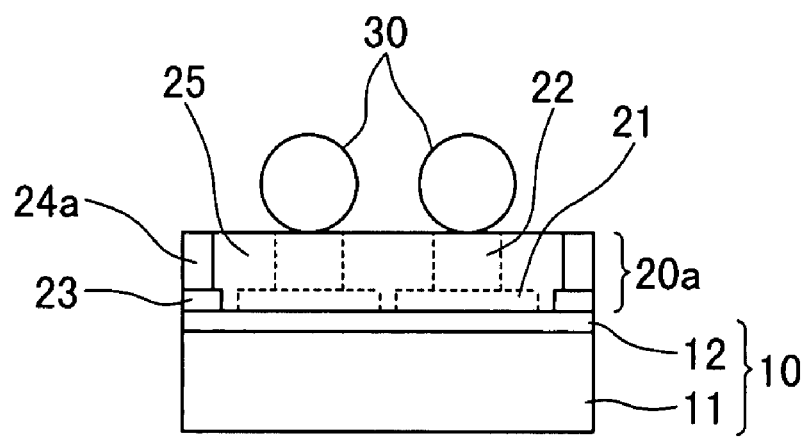
Figure 11:
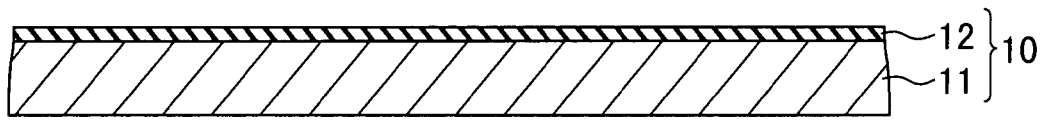
FIGS. 11 to 14 are schematic sectional views illustrating a method of manufacturing the semiconductor device in the second embodiment.
Figure 12:
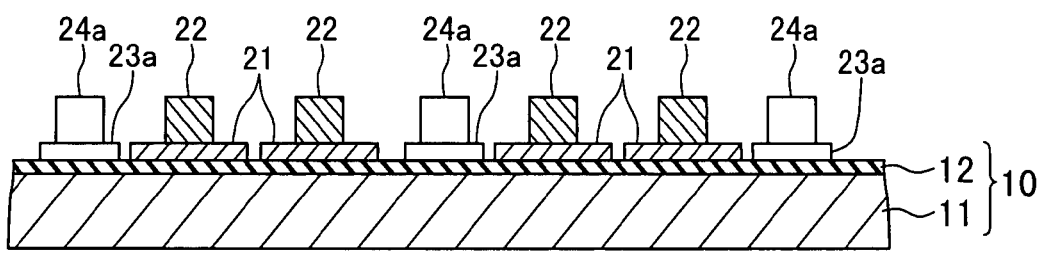
Figure 13:
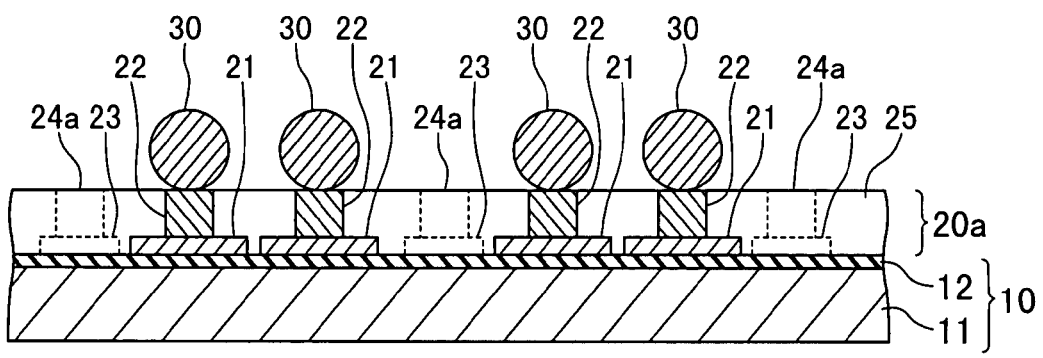
Figure 14:
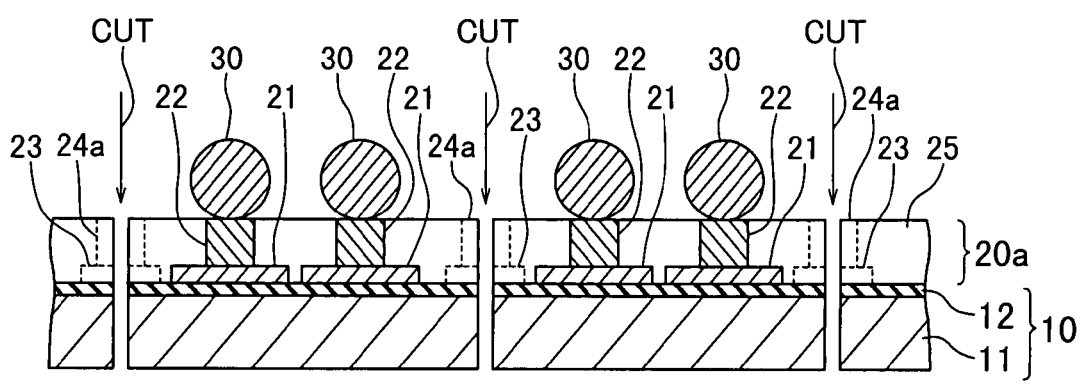

Referring to FIGS. 9 and 10, the second embodiment is similar to the first embodiment except for the shapes of the second electrodes at the four corners of the semiconductor device.

Figure 15:
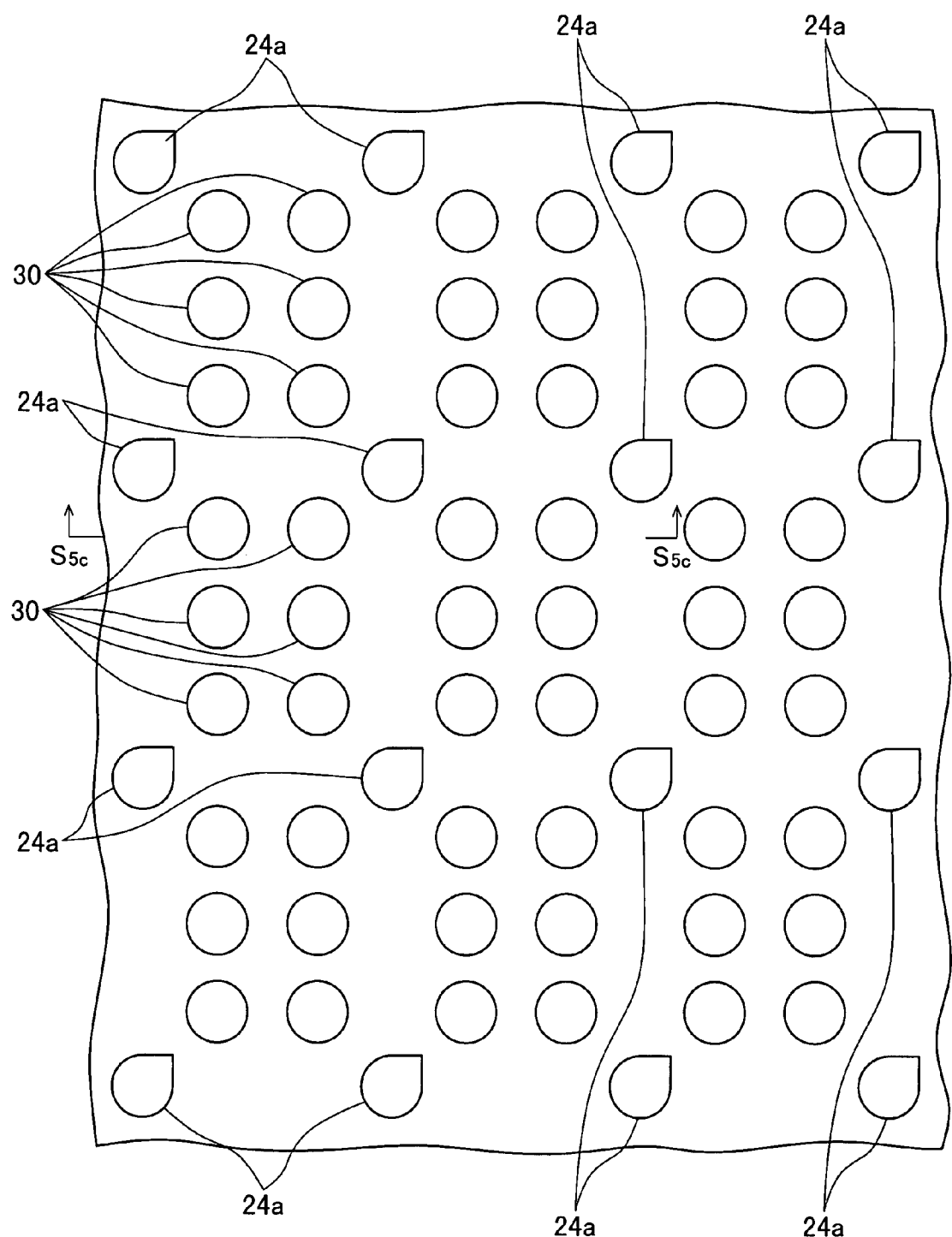
FIG. 15 is a schematic plan view of the semiconductor device in FIG. 13, before dicing.
Figure 16:
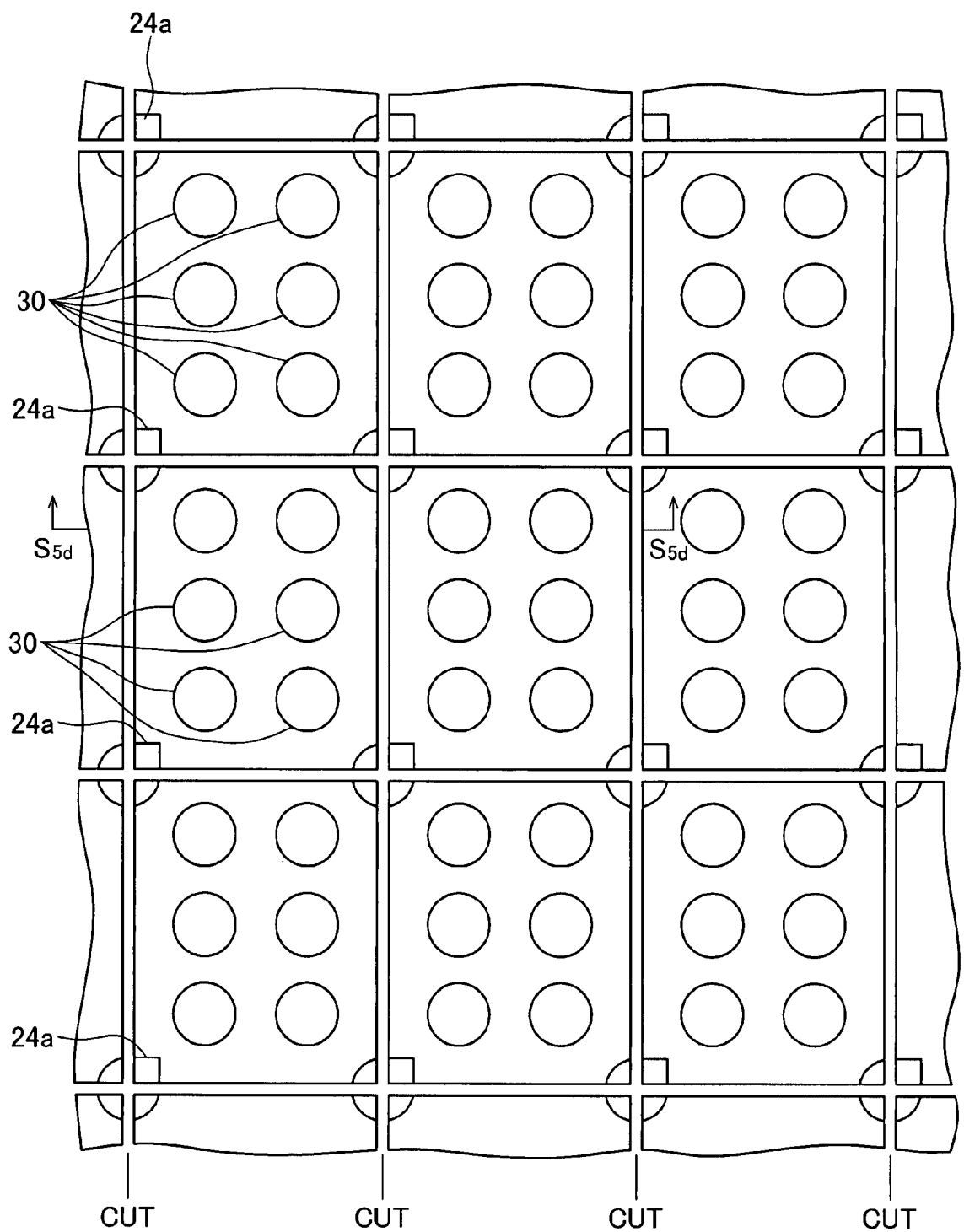
FIG. 16 a schematic plan view illustrating the dicing positions shown in FIG. 14.

The semiconductor device in the second embodiment is fabricated by the steps illustrated in FIGS. 11, 12, 13, and 14. These steps are similar to the steps shown in FIGS. 3, 4, 5, and 6 in the first embodiment, so a detailed description will be omitted. FIG. 15 shows a plan view corresponding to FIG. 13, which is a section through $S_{1c}$-$S_{1c}$ in FIG. 15. FIG. 16 shows a plan view corresponding to FIG. 14, which is a section through $S_{1d}$-$S_{1d}$ in FIG. 16.

Referring to FIGS. 15, 16, and 9, the difference between the second and first embodiments is that the shapes of the second posts 24a in the second embodiment differ from the shapes of the second posts 24 in the first embodiment. In the second embodiment, as shown in FIG. 15, each of the parts of the second posts 24a exposed on the surface of the dielectric sealing layer 25 has a shape constituting substantially three-quarters of a circular disc and one quarter of a square, instead of being fully circular. Accordingly, after the substrate 10 and a wiring layer 20a are diced along lines marked 'CUT' in FIG. 16, at a single corner of each resulting semiconductor device, the remaining part of the second post 24a has a rectangular shape, while the remaining parts of the second posts 24a at the other three corners have fanlike shapes, as shown in FIG. 9.

Accordingly, when the semiconductor devices in the second embodiment are viewed from above, one corner of each device is identified by having a rectangular second electrode, more specifically a rectangular second post 24a, while the second electrodes (second posts 24a) at the other three corners have fanlike shapes constituting substantially one-quarter of circular disc, as shown in FIG. 9.

The manufacturing process in the second embodiment forms a plurality of semiconductor devices or chips of the type shown in FIGS. 9 and 10, each having a polygonal (rectangular) shape. As in the first embodiment, the first electrodes (the first redistribution parts 21 and first posts 22) and the semiconductor circuit elements and interconnection wiring formed in the substrate 10 constitute an integrated circuit while the second electrodes, comprising the second redistribution parts 23 and second posts 24a, are dummy electrodes that reinforce the four corners of the chip but are not connected to the semiconductor circuit elements formed in the substrate 10 and do not function as part of the integrated circuit.

The chip shape is not limited to the rectangular shape shown in FIG. 9; square shapes and other polygonal shapes are also possible.

In the second embodiment, as in the first embodiment, since the substrate 10 and the wiring layer 20a are diced along lines that intersect at the second electrodes (the second redistribution parts 23 and the second posts 24a), in the four corners of each semiconductor device, the cut surfaces of the second electrodes (the second redistribution parts 23 and the second posts 24a) are exposed. As shown in FIGS. 9 and 10, accordingly, each of the four corners of the semiconductor device presents a tough metal surface, instead of a more brittle resin surface, for the full thickness of the wiring layer 20a. The second electrodes protect the corners by acting as bumpers that absorb the effect of external impact. Like the semiconductor devices formed in the first embodiment, the semiconductor devices formed in the second embodiment have enhanced reliability, and are therefore less likely to malfunction, because they can survive external impacts that would chip, crack, or otherwise damage the dielectric sealing layer of a conventional semiconductor device.

In a conventional semiconductor device with a chip-scale package, one corner or side of the semiconductor chip is identified by a seal affixed to the lower surface of the device, to ensure that the chip is mounted in the correct orientation and that the correct external connections are made. In the second embodiment, the correct orientation is identifiable from the rectangular second post 24a at one corner of the chip, so no seal has to be affixed. This is a significant advantage for a small semiconductor device with a chip-scale package in which area available for seal attachment is severely limited.

Figure 17:
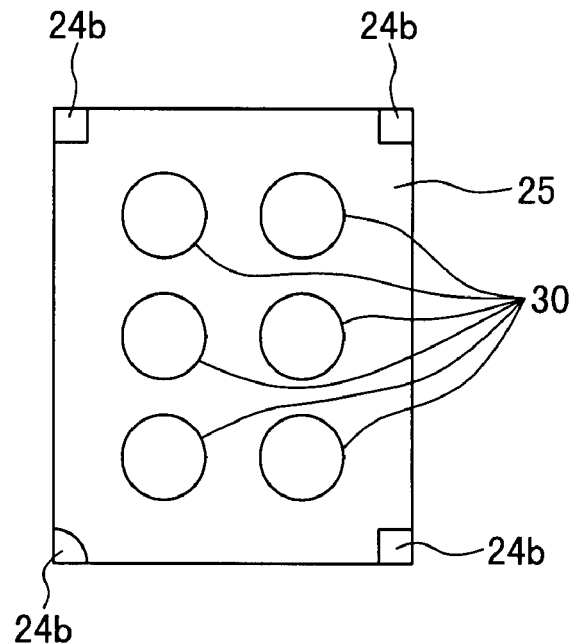
FIGS. 17 and 18 are schematic plan views illustrating variations of the semiconductor device according to the second embodiment.

In a variation of the second embodiment, shown in FIG. 17, the semiconductor device has rectangular second posts 24b at three corners and a fan-shaped second post 24b at one corner. This also identifies the orientation of the device.

Figure 18:
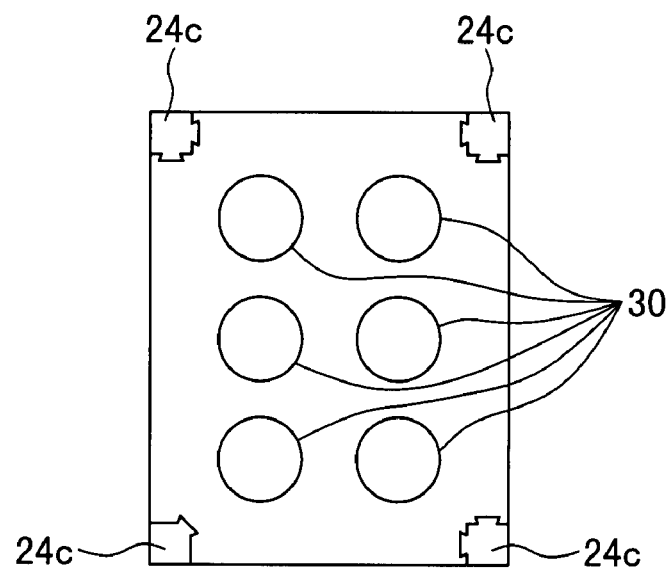

In another variation of the second embodiment, shown in FIG. 18, the second posts 24c have parts that lock into the dielectric sealing layer 25 to prevent the second posts 24c from separating from the dielectric sealing layer 25. Each of these parts has, for example, an inverted taper shape that projects into the dielectric sealing layer 25 but is narrower at the base than at the projecting end. These projections grip the dielectric sealing layer 25 in such a way that the second posts 24c cannot fall out. In the semiconductor device in FIG. 18, one second post 24c has a single inverted-taper projection, and the other three second posts 24c have two inverted-taper projections. The projections thereby identify the orientation of the device, as well as keeping the second posts 24c securely attached.

Similar effects are obtained if one of the second posts 24c has two inverted-taper projections and three of the second posts 24c have only one inverted-taper projection.

More generally, the orientation of any chip-scale package can be identified by any scheme in which the second post at one corner has a unique shape. For a non-square rectangular package, the orientation can be identified if the second posts at two mutually adjacent corners have one shape and the second posts at the other two corners have another shape.

Those skilled in the art will recognize that further variations are possible within the scope of the invention, which is defined in the appended claims.

What is claimed is:

1. A semiconductor device comprising:
   a substrate with semiconductor circuit elements formed therein; and
   a wiring layer disposed on the substrate and having a polygonal planar shape with a plurality of corners, the wiring layer including:
   a dielectric sealing layer disposed on the substrate;
   a plurality of first electrodes passing through the dielectric sealing layer in its thickness direction and connected to the semiconductor circuit elements; and
   a plurality of second electrodes, each of the second electrodes being disposed on corner side surfaces of each of the respective corners of the dielectric sealing layer so that each of the second electrodes is exposed at the corner side surfaces along a thickness of the second electrodes,
   wherein each of the plurality of corners of the wiring layer is formed throughout the thickness of the wiring layer by one of the second electrodes.

2. The semiconductor device of claim 1, wherein the plurality of second electrodes forming the plurality of corners have mutually identical shapes.

3. The semiconductor device of claim 1, wherein one of the plurality of second electrodes forming the plurality of corners has a different shape from another one of the plurality of second electrodes forming the plurality of corners.

4. The semiconductor device of claim 1, wherein the substrate is cut from a wafer on which the semiconductor circuit elements and a dielectric layer are formed.

5. The semiconductor device of claim 1, wherein the dielectric sealing layer is a resin layer.

6. The semiconductor device of claim 1, wherein each of the first electrodes includes:
   a first redistribution part formed on the substrate; and
   a first post disposed on the first redistribution part.

7. The semiconductor device of claim 1, wherein each of the second electrodes includes:
   a second redistribution part formed on the substrate; and
   a second post disposed on the second redistribution part.

8. The semiconductor device of claim 1, wherein the first and second electrodes are formed from mutually identical metal materials.

9. The semiconductor device of claim 1, wherein the first and second electrodes are formed from copper.

10. The semiconductor device of claim 1, wherein the second electrodes are electrically disconnected from the semiconductor circuit elements.

11. The semiconductor device of claim 1, wherein the second electrodes include parts that project into the dielectric sealing layer to lock the second electrodes to the dielectric sealing layer.

12. The semiconductor device of claim 11, wherein said parts of the second electrodes have a tapered shape with a base and a projecting end, the projecting end being narrower than the base.

13. The semiconductor device of claim 1, wherein each of the second electrodes are exposed along their entire thickness at the corner side surfaces.

* * * * *